US012787158B2

(12) United States Patent
Chen

(10) Patent No.: US 12,787,158 B2
(45) Date of Patent: Nov. 3, 2026

(54) ANTI-BREAK STRUCTURE FOR SETTING BUFFER SHEETS AT CIRCUIT BOARD EDGES

(71) Applicant: MEC ADDHEAT (KAIPING) CO., LTD., Kaiping City (CN)

(72) Inventor: Chienchou Chen, Kaiping City (CN)

(73) Assignee: MEC ADDHEAT (KAIPING) CO., LTD., Kaiping City (CN)

( * ) Notice: Subject to any disclaimer, the term of this patent is extended or adjusted under 35 U.S.C. 154(b) by 259 days.

(21) Appl. No.: 18/896,940

(22) Filed: Sep. 26, 2024

(65) Prior Publication Data

US 2025/0024591 A1 Jan. 16, 2025

(51) Int. Cl.

*H05K 1/02* (2006.01)
*H05B 3/34* (2006.01)
*H05K 1/03* (2006.01)

(52) U.S. Cl.

CPC ........... *H05K 1/0271* (2013.01); *H05B 3/342* (2013.01); *H05K 1/038* (2013.01)

(58) Field of Classification Search

CPC ..... H05K 1/0271; H05K 1/038; H05K 1/0281
See application file for complete search history.

(56) References Cited

U.S. PATENT DOCUMENTS

2013/0092424 A1* 4/2013 Masuda ............... H01R 43/007 216/13

* cited by examiner

*Primary Examiner* — Sherman Ng
(74) *Attorney, Agent, or Firm* — Leong C. Lei

(57) ABSTRACT

The present invention discloses an anti-break structure for setting buffer sheets at circuit board edges; the setting of polyimide (PI) or polyester films with a thickness less than 0.1 mm at PCB, copper foil circuit board or FPC board edges can help to achieve an effective isolation between electronic wires and circuit board edge corners. This structure can not only achieve protection under static conditions, but also significantly reduce potential cuts and breaks of electronic wires or heating materials under dynamic stress conditions such as washing, twisting and bending processes of wearable heating clothing. Compared with those high-cost solutions in the prior art that use more wear-resistant materials or complex processes, the present invention solves the problem of damage to connecting components at circuit board edges in a more economical manner, improving the durability and safety of equipment.

6 Claims, 7 Drawing Sheets

ANTI-BREAK STRUCTURE FOR SETTING BUFFER SHEETS AT CIRCUIT BOARD EDGES

FIELD OF THE INVENTION

The present invention relates to the field of circuit board design and manufacture technology, particularly to an anti-break structure for setting buffer sheets at circuit board edges.

BACKGROUND OF THE INVENTION

In the application of wearable heating clothing, heating elements are usually connected to electronic wires through PCBs, copper foil circuit boards or FPC boards. These circuit boards serving as carriers for power connections carry electrical connections between heating materials and power sources.

However, as wearable heating clothing frequently experiences dynamic stress generated due to washing, twisting and bending, existing circuit board structures are suffering from some serious problems during actual use.

Specifically, circuit board edges, especially those sharp edge corners, are prone to cutting or squeezing connected electronic wires or heating materials under stress, resulting in break of electronic wires or damage to heating materials. This physical damage not only affects the normal function of equipment, but may also pose potential safety hazards and even lead to dangerous hot spots.

As shown in FIGS. 1-8, wearable heating clothing needs to be washed after being used; it is always washed with washing machines and dryers, therefore, regardless of whether PCBs with electronic wires connected in heating elements or printed heating films or carbon based films used, copper foil or FPC boards are needed to be used as carriers for power connection for the sake of mutual connection, because twisting and bending stress of heating elements generated during a laundry process is prone to cause defects or hidden hazards such as connected electronic wires being broken or cut by PCB or copper foil or FPC board edge corners due to board edge impact.

As shown in FIG. 5, during bonding a heating carbon based film or carbon paste printed film with a copper foil or FPC board using conductive adhesive, the sharp edges of the copper foil (thickness 0.03-0.05 mm) or FPC board (thickness 0.1-0.2 mm) can easily cut the carbon based film or carbon paste printed film, causing dangerous hot spots.

In the prior art, in order to avoid this problem, it is usually necessary to use or develop more wear-resistant and higher quality materials, or adopt complex processes to improve their wear resistance. However, these methods can significantly cause an increase cost. Moreover, even with these expensive materials and processes, physical damage to circuit boards is still hard to be completely avoided under dynamic stress conditions, especially under frequent bending and twisting.

Therefore, how to provide an effective circuit board edge protection structure without significantly causing an increase of cost to prevent damage to electronic wires or heating materials due to dynamic stress has become a technical problem to be solved by the present invention.

DESCRIPTION OF THE UTILITY MODEL

Considering the defects existing in the prior art, the present invention is intended to provide an anti-break structure for setting buffer sheets at circuit board edges to solve the technical problem of physical damage to electronic wires or heating materials caused by circuit board edges proposed in the background technology.

To solve the above technical problem, the present invention adopts the following technical solution:

An anti-break structure for setting buffer sheets at circuit board edges, which has a circuit board body involving one surface and sides for wiring;

This anti-break structure for setting buffer sheets at circuit board edges also involves buffer sheets;

The buffer sheets are connected to edges near the sides for one surface of a circuit board body for achieving buffering and protection between circuit board edges and electronic wires;

The circuit board body involves edge corners;

The buffer sheets are set between edge corners and electronic wires to prevent cuts, breaks or damages caused by contact between electronic wires and edge corners due to stress generated during washing or wearing.

As a further solution of the present invention, the circuit board body can be a PCB, a copper foil circuit board or an FPC board.

As a further solution of the present invention, the thickness of a piece of buffer sheet is less than 0.1 mm.

As a further solution of the present invention, the buffer sheets are made of EDF materials that include but are not limited to PI or polyester films.

As a further solution of the present invention, the front half of one side of each buffer sheet is fixedly connected to the corresponding part near the side of one surface of a circuit board body for wiring, so that the extended buffer sheet part can form a 5~10 mm extended carrying & buffer protection portion.

As a further solution of the present invention, the fixed connection is achieved through bonding.

Compared with the prior art, the beneficial effects of the present invention are:

1. Dual function of buffering and protection: The present invention achieves an effective isolation between electronic wires and circuit board edges by setting flexible buffer sheets with a thickness less than 0.1 mm at circuit board edges. This design can not only achieve a physical isolation under static conditions, but also plays a significant buffering role under dynamic stress conditions (twisting, bending and washing), reducing the possibility of electronic wires coming into contact with sharp edges and effectively preventing potential cuts and breaks.

2. Easy manufacture process: The anti-break structure and its manufacture method involved in the present invention are easy and simple; buffer sheets can be firmly connected to circuit board edges through bonding or other fixing methods, ensuring that they will not shift or fall off during use or washing. This can not only help to reduce manufacture costs, but also improve production efficiencies, especially in large-scale production.

Additional aspects and advantages of the present invention will be partially presented in the following description, some of which will become clear from the following description, or learned through embodiments of the present invention.

DESCRIPTION OF THE DRAWINGS

To provide a clearer explanation of the embodiments of the present invention or the technical solutions in the prior art, the drawings required for the description of the embodiments are briefly introduced; it is obvious that the drawings below are only used for some embodiments of the present invention; common technicians in the art can also obtain other drawings based on these drawings without any creative labor.

The marks and names in the figures are as follows.

Figure 1:
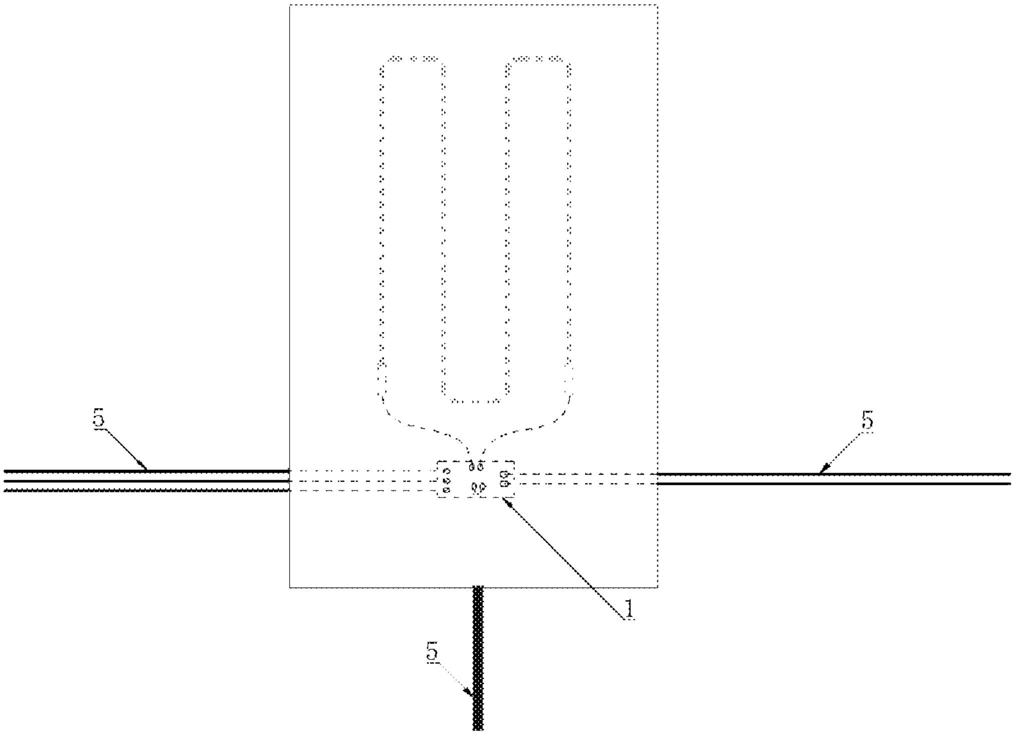
FIG. 1 shows a structure diagram of a heating element when an existing PCB is bonded with a heating material.
Figure 2:
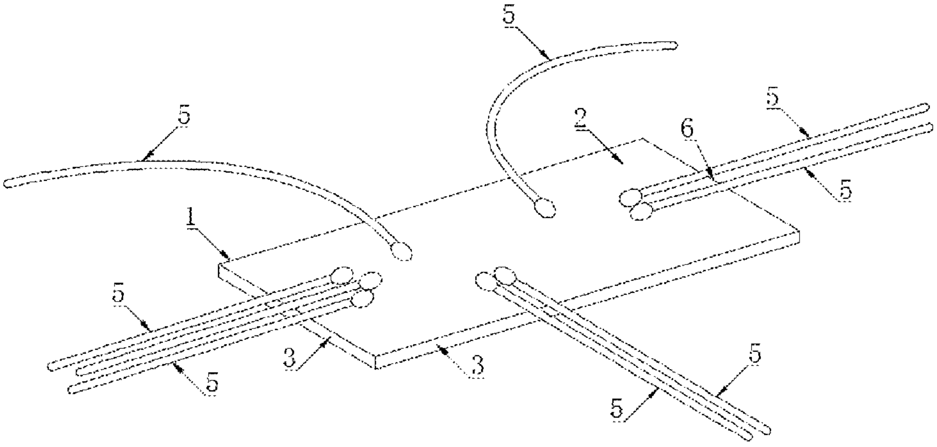
FIG. 2 shows a structure diagram when an existing PCB is soldered with electronic wires.
Figure 3:
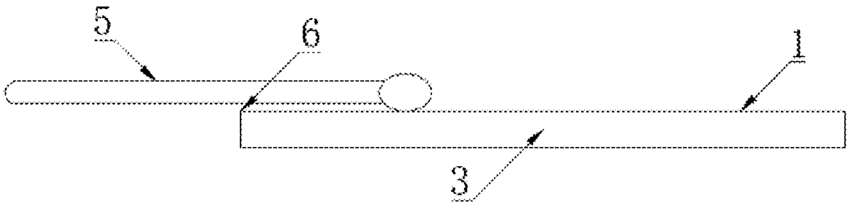
FIG. 3 shows a structure diagram from another viewing angle of FIG. 2.
Figure 4:
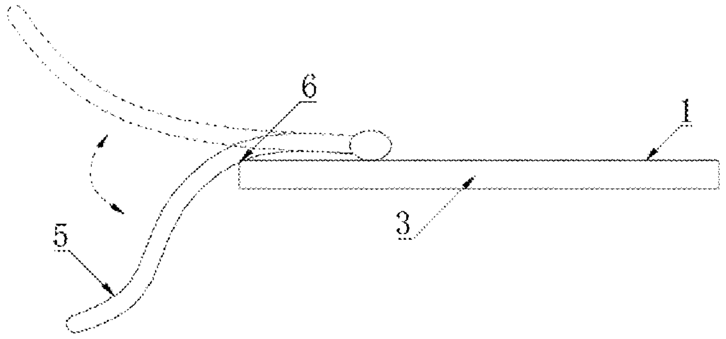
FIG. 4 shows a structure diagram when an electronic wire is impacted by an existing PCB edge.
Figure 5:
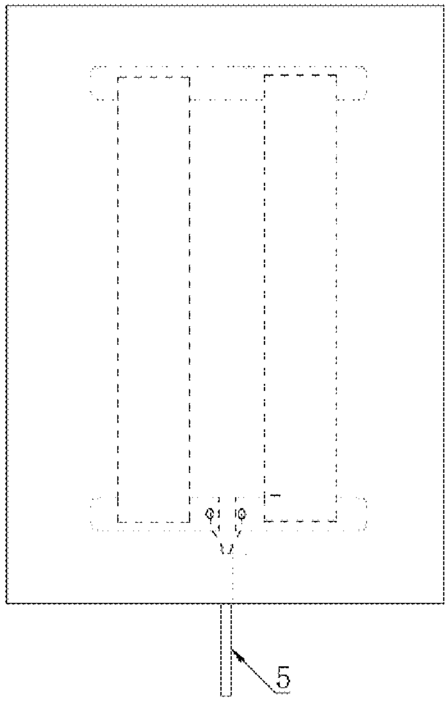
FIG. 5 shows a structure diagram of a heating element when an existing copper foil or FPC board is bonded with a heating material.
Figure 6:
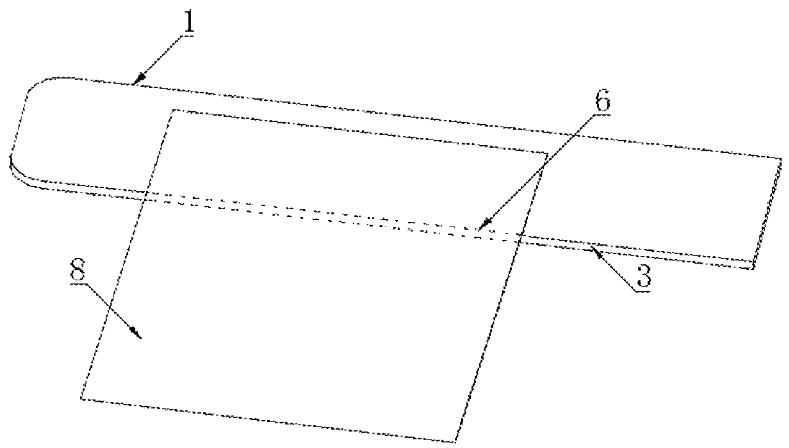
FIG. 6 shows a structure diagram when an existing copper foil or FPC board is bonded with a carbon based film or carbon paste film.
Figure 7:
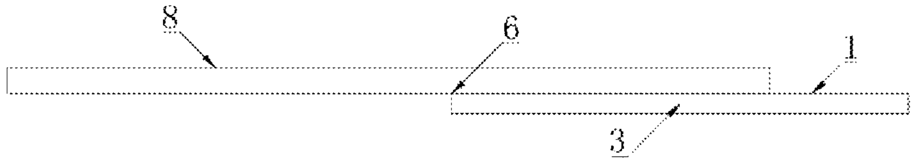
FIG. 7 shows a structure diagram from another viewing angle of FIG. 6.
Figure 8:
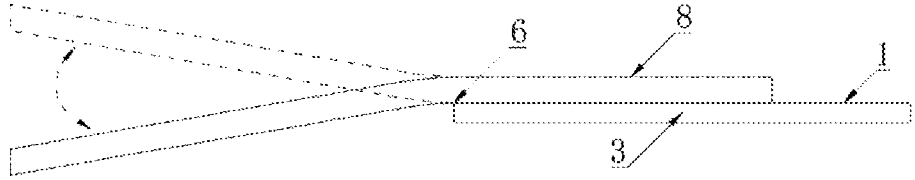
FIG. 8 shows a structure diagram when a carbon based film or carbon paste film is impacted by an existing copper foil or FPC board edge.

Circuit board body 1, one surface 2, side 3, buffer sheet 4, electronic wire 5, edge corner 6, extended carrying & buffer protection portion 7, and heating element 8.

DETAILED DESCRIPTION OF THE EMBODIMENTS

The following will provide a clear and complete description of the technical solutions regarding the embodiments of the present invention. It is obvious that the described embodiments are only a part of those of the present invention. Based on the embodiments of the present invention, all other embodiments obtained by common technicians in the art without making creative labor shall fall within the protection of the present invention.

Figure 9:
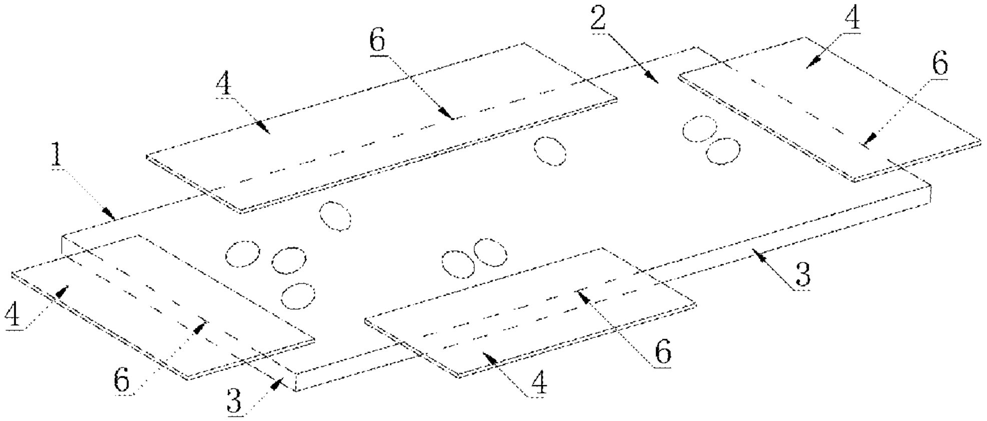
FIG. 9 shows a structure diagram of the present invention when a PI film is bonded on a PCB edge.
Figure 10:
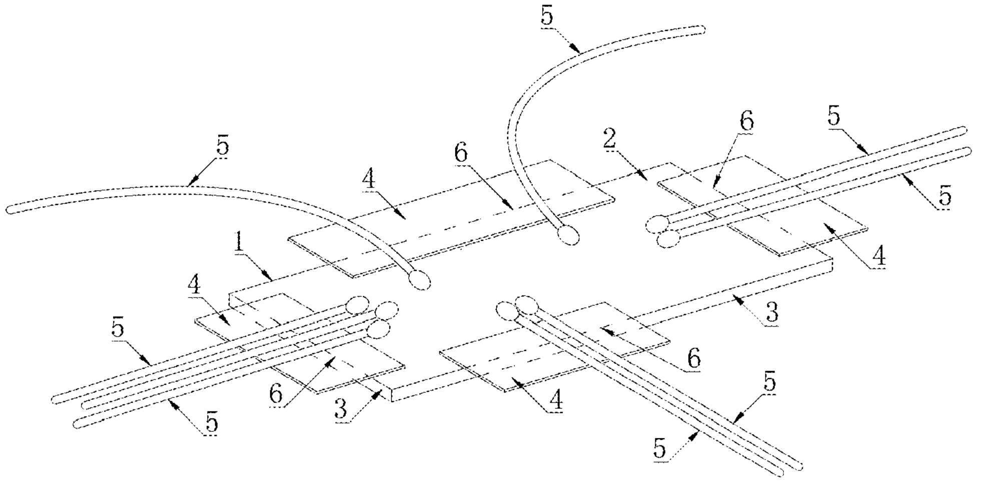
FIG. 10 shows a structure diagram of the present invention when electronic wires are carried by PI films.
Figure 11:
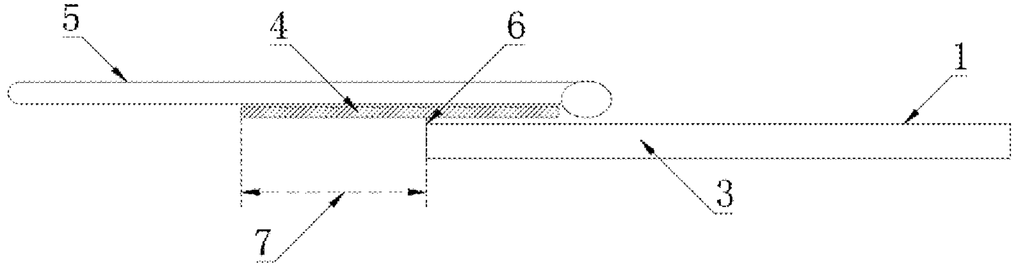
FIG. 11 shows a structure diagram from another viewing angle of FIG. 10.
Figure 12:
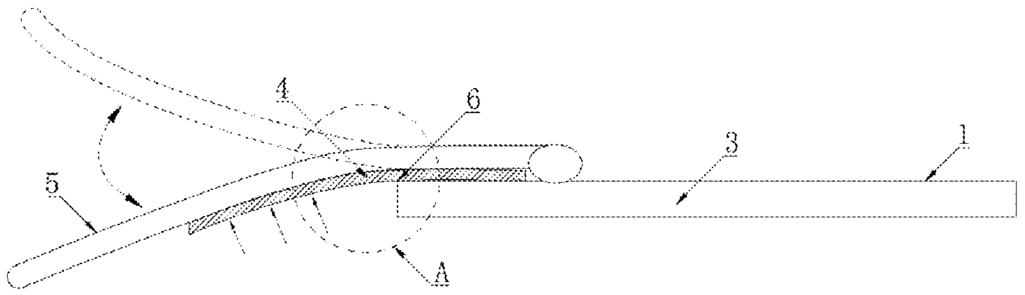
FIG. 12 shows a structure diagram of the present invention when an electronic wire is carried by a PI film to buffer an acute angle impact.
Figure 13:
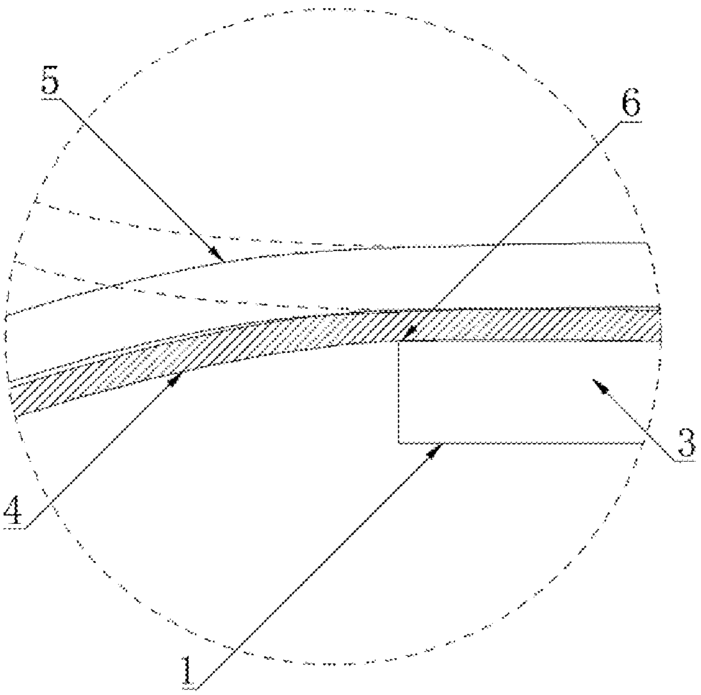
FIG. 13 shows an enlarged schematic diagram of part A in FIG. 12.
Figure 14:
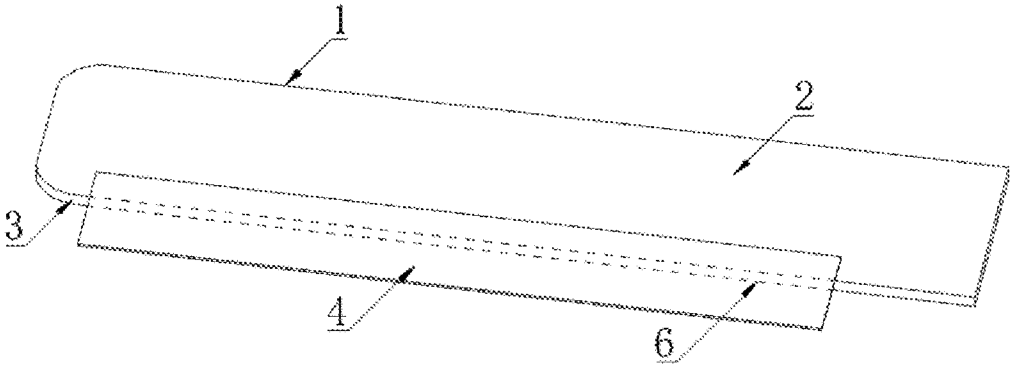
FIG. 14 shows a structure diagram of the present invention when a copper foil or FPC board is bonded with a PI film.
Figure 15:
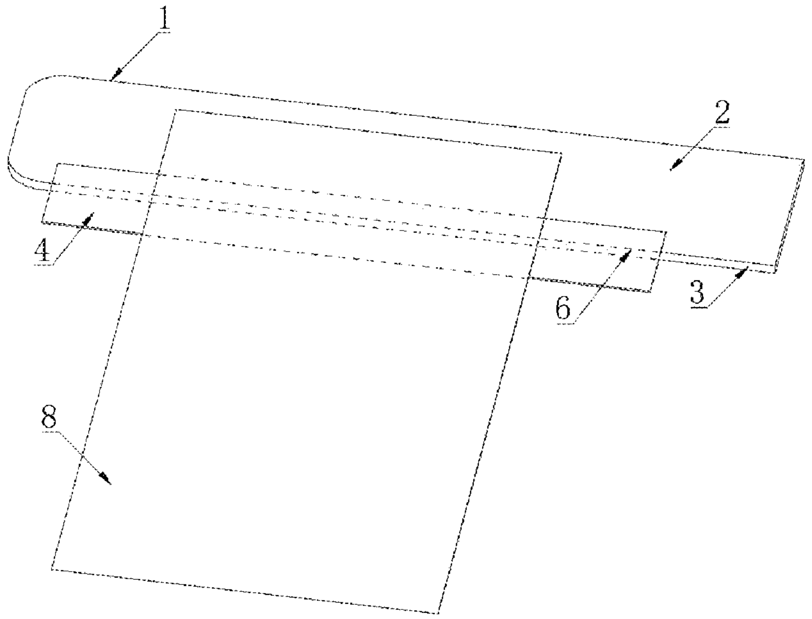
FIG. 15 shows a structure diagram of the present invention when a PI film carries a carbon based film or carbon paste film.
Figure 16:
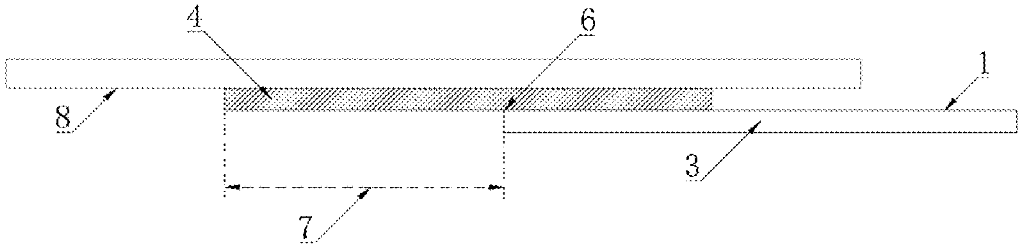
FIG. 16 shows a structure diagram from another viewing angle of FIG. 15.
Figure 17:
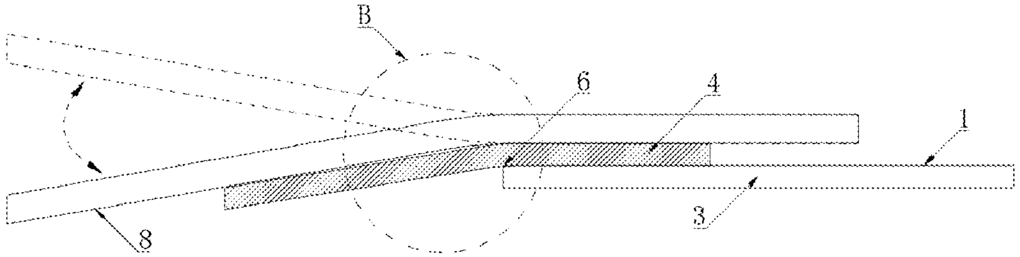
FIG. 17 shows a structure diagram of the present invention when a carbon based film or carbon paste film is protected by a PI film.
Figure 18:
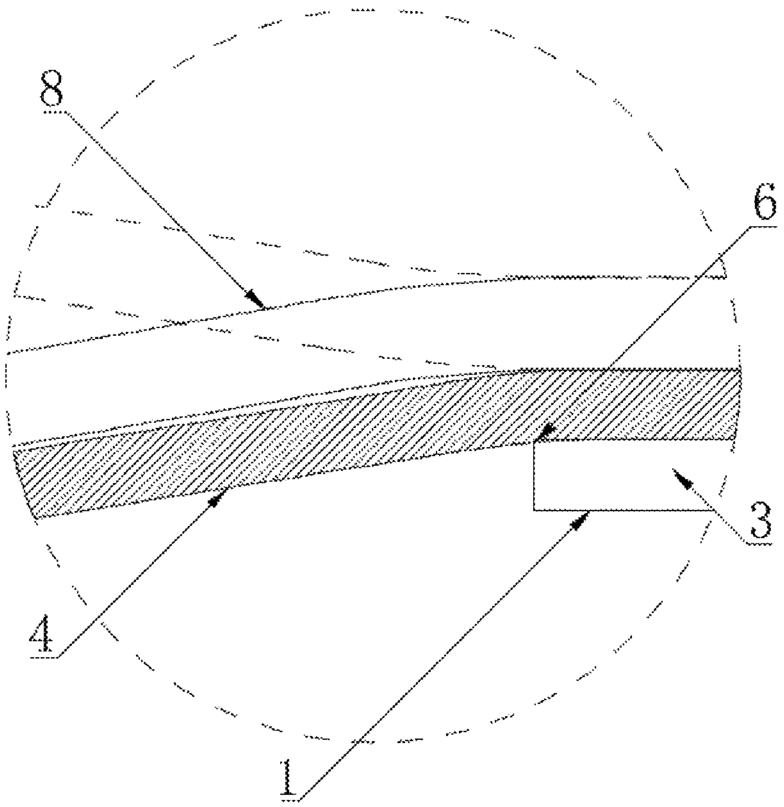
FIG. 18 shows an enlarged schematic diagram of part B in FIG. 17.

As shown in FIGS. 9-18, in the embodiments of the present invention, an anti-break structure for setting buffer sheets at circuit board edges, which has a circuit board body 1; the circuit board body 1 involves one surface 2 and sides 3 for wiring; this anti-break structure for setting buffer sheets at circuit board edges also involves buffer sheets 4; the buffer sheets 4 are connected to edges near the sides 3 for one surface 2 of a circuit board body 1 for achieving buffering and protection between circuit board edges and electronic wires 5; the circuit board body 1 involves edge corners 6; the buffer sheets 4 are set between edge corners 6 and electronic wires 5 to prevent cuts, breaks or damages caused by contact between electronic wires 5 and edge corners due to stress generated during washing or wearing.

The circuit board body 1 can be a PCB, a copper foil circuit board or an FPC board. The thickness of a piece of buffer sheet 4 is less than 0.1 mm. The buffer sheets 4 are made of EDF materials; the EDF materials include but are not limited to PI or polyester films. The front half of one side of each buffer sheet 4 is fixedly connected to the corresponding part near the side 3 of one surface 2 of a circuit board body 1 for wiring, so that the extended buffer sheet 4 part can form a 5~10 mm extended carrying & buffer protection portion. The fixed connection is achieved through bonding.

An anti-break method for setting buffer sheets at circuit board edges, which comprises the following steps:

- S1: Provide a circuit board involving one surface 2 and sides 3 for wiring; the circuit board edges involve edge corners 6;
- S2: Prepare a piece of buffer sheet 4 made of an EDF material;
- S3: Fix the buffer sheet 4 to one surface 2 of the circuit board; the fixing position should be close to the circuit board side 3 edge, so that part of the buffer sheet 4 can be extended, forming an extension portion for protecting electronic wires 5;
- St4: Adjust the extension portion of the buffer sheet 4 to cover a part between a circuit board edge corner 6 and electronic wires 5, achieving buffering and preventing cutting, breaking or damage to the electronic wires 5 caused by stress generated during washing or use.

A method for making an anti-break structure, which comprises the following steps:

- S1: Select a circuit board and an edge corner 6 of the circuit board;
- S2: Select a flexible buffer sheet 4 with a thickness less than 0.1 mm and cut it to an appropriate size;
- S3: Fix a portion of the buffer sheet 4 onto one surface 2 of the circuit board, be sure that the extension portion of buffer sheet 4 covers the part between the circuit board edge corner 6 and electronic wires 5;
- S4: Be sure that the buffer sheet 4 remains stable after fixation and will not shift or fall off during use or washing.

The edge corner 6 of the circuit board body 1 should be rounded to further reduce potential physical damage to the electronic wires 5. The surface of the buffer sheet 4 should be anti-statically coated to prevent potential damage to the electronic wires 5 caused by static electricity accumulation.

The innovation of the present invention is setting thin and elastic PI or polyester films or similar sheets (thickness below 0.1 mm) on related PCB, copper foil or FPC board edges to buffer breaking or cutting of the PCB, copper foil or FPC board edges due to stress impact caused by exercises.

As shown in FIGS. 9-13, in the present invention, for the anti-break protection design for the bonded circuit between the PCB and electronic wires 5: one or more PI or polyester films with a thickness less than or equal to 0.1 mm can be set at the PCB edges; an extension of 5-10 mm can be left to carry the electronic wires 5 in order to buffer cutting them by sharp PCB edges during use or washing and prevent break of electronic wires 5 in their sheaths due to impact.

As shown in FIGS. 14-18, in the present invention, for the anti-cutting protection design for the bonding between the copper foil or FPC board and carbon based film: one or more PI films with a thickness less than or equal to 0.05 mm can be set at the edge bonding position between the copper foil or FPC board and carbon past films or carbon based films; an extension of 5-10 mm can be left to carry heated carbon film sheets in order to reduce potential scalds caused by copper foil or FPC board edges during use or washing. At the bonding position between the FPC board and carbon film or carbon paste printing film, a PI film can be placed between the FPC board and heating material (carbon base film or carbon paste film) to prevent damage caused by sharp cutting of the FPC board edges.

Embodiment 1

In the application of wearable heating clothing, heating elements 8 are usually connected to electronic wires through PCBs, copper foil circuit boards or FPC boards. These heating elements 8 are widely used in scenarios such as outdoor work, sportswear and medical care clothing that require durability and high safety. However, in these application scenarios, heating clothing often needs to withstand dynamic stresses generated during frequent washing, bending and twisting, resulting in physical friction or squeezing between existing circuit board edges and electronic wires 5 or heating materials, thereby posing potential break of the electronic wires 5 or damage to heating materials.

In order to solve this problem, this embodiment provides an anti-break structure for setting buffer sheets 4 at PCB, copper foil circuit board or FPC board edges. Specifically, the buffer sheets 4 with a thickness less than 0.1 mm each can be bonded to circuit board edges of heating clothing, especially to edge corners 6; the buffer sheets 4 can be fixed to the edges near the sides 3 for a wiring surface of a circuit board body by bonding; their extended parts can be used as carrying and buffer protection portions 7 through covering circuit board edge corners 6 and parts between them and electronic wires 5.

In practical use, when the heating clothing is subjected to stress generated by twisting and bending during washing or wearing, the buffer sheets 4 can help to significantly reduce direct impact and friction of circuit board edges on electronic wires 5 or heating materials. Due to the flexibility and elasticity of the buffer sheets 4, even under dynamic stress conditions, the circuit board edge corners 6 can still maintain an effective isolation from the electronic wires 5, effectively preventing break of the electronic wires 5 and damage to the heating materials.

According to the relevant testing results, the design of this embodiment is quite effective in repeated washing and use; Compared with traditional high-cost materials or complex process solutions, it can not only help to significantly reduce manufacture costs, but also effectively improve the durability and safety of heating clothing, avoiding potential safety hazards such as the formation of dangerous hot spots.

Embodiment 2

For wearable heating clothing that uses carbon based films or carbon paste films as the heating material, FPC boards or copper foil circuit boards are usually used to connect the heating material to the power supply. Such heating clothing is widely used in outdoor or healthcare scenarios that require constant temperature control thanks to its lightweight and flexible performance. However, in practical use, especially during washing, wearing or exercises, the flexible circuit board or copper foil circuit board edges are prone to cutting or squeezing the film heating material, causing damage to the heating material and forming dangerous hot spots, seriously affecting the safety and lifespan of heating clothing.

In order to solve the above problem, in this embodiment, a layer of PI film or similar flexible material sheet with a thickness less than or equal to 0.05 mm is bonded on the circuit board edge. The sheet is bonded on the connection position between the FPC board or copper foil circuit board and carbon based film or carbon paste film, and the extended part can be used as a carrying and buffer protection portion 7 to carry and protect the heating film material.

During the use or washing of the heating clothing, especially when the flexible circuit board is deformed due to bending, twisting or external forces, the PI film can help to effectively reduce the direct impact or cutting of the circuit board edge on the carbon based film or carbon paste film. Due to its excellent elasticity and durability, the sheet can ensure a continuous protection under dynamic stress conditions, effectively preventing damage to the heating material and avoiding formation of hot spots.

According to this embodiment, the safety and durability of the heating clothing can be significantly improved, especially under frequent washing and complex exercise conditions, which can maintain the integrity and functionality of the heating material for a long time. Compared with existing high-cost processes, the present invention solves the problem of physical damage to heating materials at circuit board edges in an economically efficient manner, ensuring the reliability of the heating clothing and safety of users in practical applications.

In the present invention, unless otherwise specified and limited, the terms “installation”, “setting”, “connection”, “fixation”, “rotatably connection” and other terms should be broadly understood, for example, they can be fixed connections, detachable connections, or integrated; It can be a mechanical connection or an electrical connection; it can be a direct connection or an indirect connection through an intermediate medium; it can be a connection within two components or an interaction relationship between two components; unless otherwise specified, common technicians in this art can understand the specific meanings of the above terms in the present invention according to the actual circumstances.

For those technicians in the art, it is obvious that the present invention is not limited to the details of the exemplary embodiments mentioned above, and can be achieved in other specific forms without departing from the spirit or essential features of the present invention. Therefore, in any case, the embodiments should be regarded as exemplary and nonrestrictive, and the scope of the present invention should be limited by the claims rather than the above description, so it is intended to cover all variations regarding the meanings and extents of the equivalent elements of the claims within the scope of the present invention.

The invention claimed is:

1. An anti-break structure for setting buffer sheets at circuit board edges, which has a circuit board body involving one surface and sides for wiring, and is characterized in that:

This anti-break structure for setting buffer sheets at circuit board edges also involves buffer sheets;

The buffer sheets are connected to edges near the sides for one surface of a circuit board body for achieving buffering and protection between circuit board edges and electronic wires;

The circuit board body involves edge corners;

The buffer sheets are set between edge corners and electronic wires to prevent cuts, breaks or damages caused by contact between electronic wires and edge corners due to stress generated during washing or wearing.

2. The anti-break structure for setting buffer sheets at circuit board edges according to claim 1, which is characterized in that the circuit board body can be a PCB, a copper foil circuit board or an FPC board.

3. The anti-break structure for setting buffer sheets at circuit board edges according to claim 1, which is characterized in that the thickness of a piece of buffer sheet is less than 0.1 mm.

4. The anti-break structure for setting buffer sheets at circuit board edges according to claim 1, which is characterized in that the buffer sheets are made of EDF (elastic durable flexible) materials; the EDF materials include but are not limited to PI or polyester films.

5. The anti-break structure for setting buffer sheets at circuit board edges according to claim 1, which is characterized in that the front half of one side of each buffer sheet is fixedly connected to the corresponding part near the side of one surface of a circuit board body for wiring, so that the extended buffer sheet part can form a 5~10 mm extended carrying & buffer protection portion.

6. The anti-break structure for setting buffer sheets at circuit board edges according to claim 5, which is characterized in that the fixed connection is achieved through bonding.

* * * * *